March 18, 1969 T. L. ROBINSON 3,433,677
FLEXIBLE SHEET THIN-FILM PHOTOVOLTAIC GENERATOR
Original Filed Dec. 26, 1962
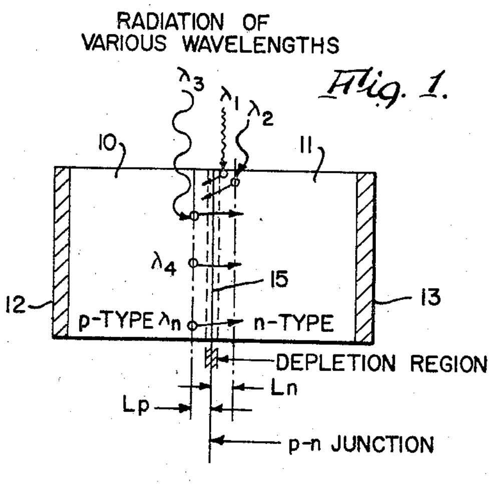
FIG. 1
FIG. 4
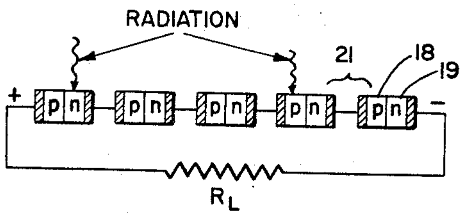
FIG. 2, FIG. 3
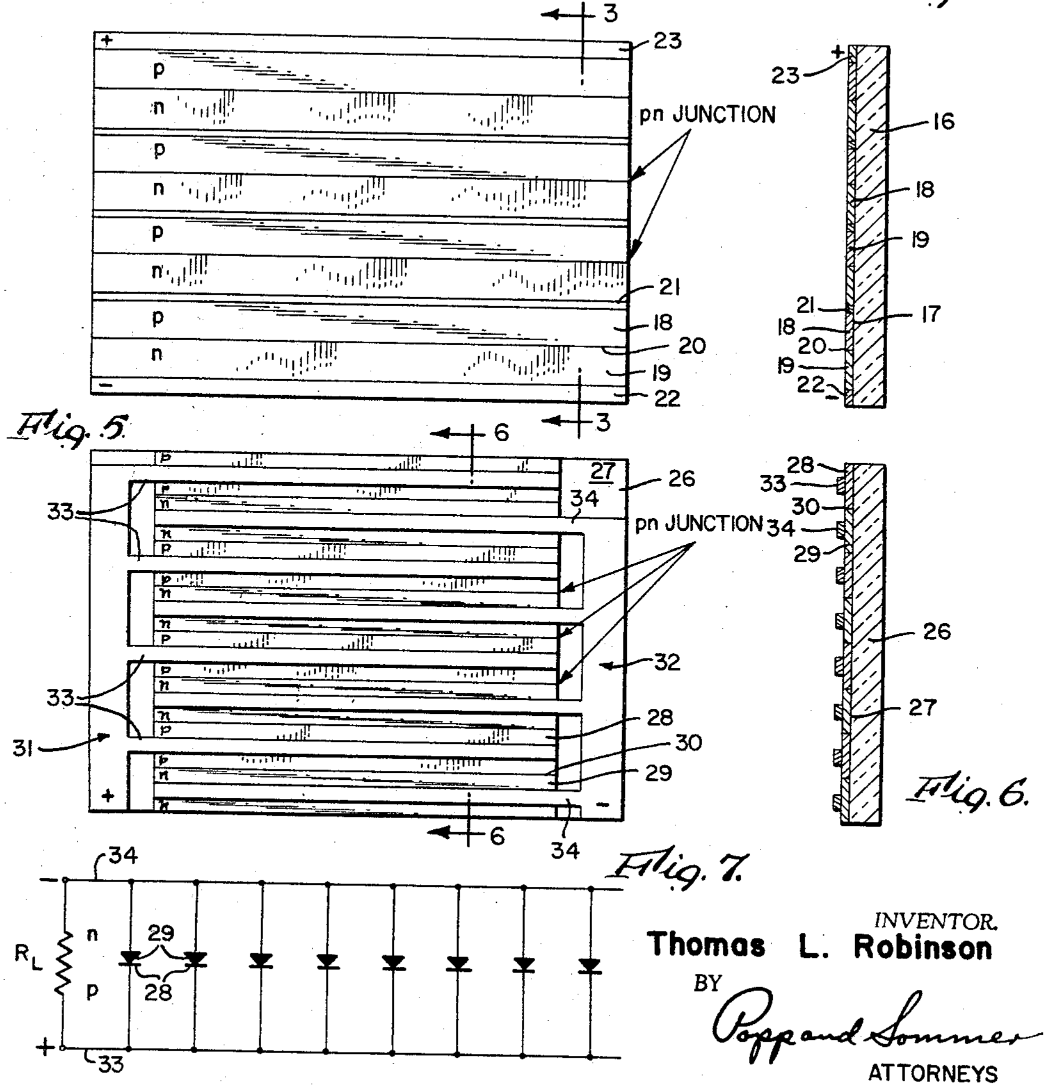
FIG. 5, FIG. 6, FIG. 7
INVENTOR.
Thomas L. Robinson
BY
Popp and Sommer
ATTORNEYS United States Patent Office 3,433,677
Patented Mar. 18, 1969

3,433,677
FLEXIBLE SHEET THIN-FILM PHOTOVOLTAIC GENERATOR

Thomas L. Robinson, Buffalo, N.Y., assignor to Cornell Aeronautical Laboratory Inc., Buffalo, N.Y., a corporation of New York Continuation of application Ser. No. 246,909, Dec. 26, 1962. This application Apr. 5, 1967, Ser. No. 628,784
U.S. Cl. 136—89 3 Claims
Int. Cl. H01l 15/02

This application is a continuation of Ser. No. 246,909, filed Dec. 26, 1962 and now abandoned.

This invention relates to an improved photovoltaic generator, and more particularly to a solar cell for generating electrical power for use in a spacecraft.

Present-day solar cells for use in spacecraft are complex, heavy, costly, require extensive supporting structures, and are subject to radiation damage.

The primary object of the present invention is to provide a thin-film solar cell which is efficient, is of lightweight, is flexible, has a large area which can be measured in square feet or square yards, is a resistant to high energy radiation damage, and is relatively simple to manufacture.

Other objects and advantages of the invention will be apparent from the following description of preferred embodiments thereof illustrated in the accompanying drawings wherein:

FIG. 1 is a configuration of a semiconductor p-n junction constructed in accordance with the principles of the present invention, illustrated on a greatly exaggerated scale, to depict carrier collection efficiency.

FIG. 2 is a schematic elevational view of the face of one form of photovoltaic generator embodying the present invention and illustrating the side exposed to incident radiation.

FIG. 3 is a vertical sectional view thereof, still schematic, taken on line 3—3, FIG. 2.

FIG. 4 is a diagram depicting the equivalent electrical circuit of the generator shown in FIG. 2.

FIG. 5 is a schematic elevational view of the face of another form of photovoltaic generator embodying the present invention and illustrating the side exposed to incident radiation.

FIG. 6 is a vertical sectional view thereof, still schematic, takne on line 6—6, FIG. 5.

FIG. 7 is a diagram depicting the equivalent electrical circuit of the generator shown in FIG. 5.

For high conversion efficiency, an electron-hole pair should be generated within a diffusion length of the junction between p- and n-type semiconductors for each photon adsorbed. A diffusion length is defined as the average distance minority carriers diffuse before they combine. Also for high conversion efficiency, the junction depth should be smaller than the carrier diffusion length. When these conditions are satisfied, the minority carriers will have assurance of reaching the junction before recombining, thus contributing to the photovoltage. The generator of the present invention fulfills these requirements.

The generation of charged carriers within the semiconductor varies with the wave length of the incident light radiation. Referring to FIG. 1, a p-type semiconductor element 10 is shown as abutting an n-type semiconductor element 11, these elements being operatively associated with ohmic contacts indicated at 12 and 13, respectively. The abutting engagement between the elements 10 and 11 provides a p-n junction represented by the numeral 15. The dimension $L_p$ extending perpendicular to the junction 15 denotes the diffusion length in the p-region. The dimension $L_n$ extending perpendicular to the junction 15 denotes the diffusion length in the n-region.

The radiation of various wavelengths of light is represented by $\lambda_1$, $\lambda_2$ and $\lambda_3$. It will be noted that the direction of radiation is parallel to the plane of the p-n junction 15. Where the radiation enters the p-type region, photons create carriers in the p-type region at a depth corresponding to the wavelength or energy level of the photons. Photons entering the n-type region produce electron-hole pairs in the n-type region at a depth corresponding to the wavelength or energy level of the photons. In other words, photons of different wavelengths will have a different depth of penetration into the semiconductor material parallel to the junction 15. However, only the charge carriers generated within a diffusion length $L_p$ or $L_n$ will reach the junction 15. The circles shown associated with arrows in FIG. 1 denote uncaptured carriers swept across the junction 15. All carriers from photons of long and short wavelengths are automatically generated within a diffusion length on both sides of the junction 15, and therefore contribute to the photovoltaic current. Thus this configuration of p-type and n-type semiconductor elements with the edge of the p-n junction exposed to the radiation will respond to a wide radiation spectrum, and hence have a high carrier collection efficiency.

Conventional silicon solar cells suffer radiation damage from high energy particles in outer space, which causes a reduction in power output. The radiation damage produces lattice vacancies that trap charge carriers and these tend to reduce the minority carrier lifetime and diffusion length. The basic solar cell illustrated in FIG. 1 has its p-n junction 15 oriented so as not to be susceptible to radiation damage. Therefore the spectrum collection efficiency of the cell will not fall off as the diffusion length and carrier lifetimes are reduced. There will always be charge carriers generated by the total absorption spectrum within a diffusion length of both sides of the p-n junction 15, regardless of how short the diffusion length $L_p$ and $L_n$ may become.

A large area, thin-film photovoltaic generator having the p-n junction oriented as in FIG. 1 must have a large number of such junctions connected in series in order to generate a desired voltage output. Such a series arrangement of a multiple p-n junction structure is schematically illustrated in FIG. 2. Referring to FIGS. 2 and 3, a lightweight, insulating substrate or base 16 having a flat surface 17 on one side is provided for supporting the thin-film p-type and n-type semiconductor elements 18 and 19, respectively. The substrate may comprise a thin metal foil having a thickness of about one-half mil, vapor-coated with SiO or $SiO_2$ to form a thin, flexible insulated sheet. The p-type and n-type elements are provided in a multiplicity of pairs in each of which the elements 18 and 19 abut each other to provide therebetween a p-n junction typically indicated at 20.

The elements 18 and 19 may be semiconductor materials selected from the group comprising gallium arsenide, gallium phosphide, zinc sulfide, cadmium sulfide, cadmium telluride, germanium, silicon, indium phosphide, lead sulfide, lead selenide and lead telluride. The elements 18 and 19 are applied to the substrate surface 17 in any suitable manner. For example, these semiconductor materials may be deposited by vacuum deposition, ionic sputtering, or chemical deposition. The thickness of the elements 18 and 19 in FIG. 3 is greatly exaggerated for clarity. The thickness of these elements will be in the range from about one to five microns, depending on the energy gap of the semiconductor material used.

The various pairs of n-type and p-type elements are oriented on the substrate surface as illustrated in FIG. 2. Interposed between adjacent pairs of such elements are ohmic contacts 21 which are also arranged as thin strips supported on the substrate surface 17. At one end, namely the upper end shown in FIG. 2, the endmost p-type element is shown as electrically contacting an electrode or ohmic terminal 23. At the other end, or the lower end as viewed in FIG. 2, the endmost n-type element is shown as electrically contacting another electrode or ohmic terminal 22. The terminals 22 and 23 are also thin-films supported on the substrate surface 17. The ohmic contacts 21 and terminals 22 and 23 are formed of any suitable conductive metal, which does not produce rectification at the semiconductor metal interface.

The series circuit provided by the arrangement shown in FIGS. 2 and 3 is depicted in FIG. 4 and connected across a load resistance represented at $R_L$.

If desired, a parallel arrangement of various structural p- and n-type elements may be provided. Such a parallel arrangement is shown in FIGS. 5–7. There is a thin, flexible insulating substrate 26 having a flat surface 27 on one side and shown as supporting a plurality of p-type and n-type photoconductor elements 28 and 29, respectively. These elements are alternately arranged as narrow bands or strips and in contact with each other so as to provide p-n junctions indicated at 30. Interdigital electrodes or ohmic terminals 31 and 32 are shown supported on the substrate 26. The terminal 31 has integral contact fingers 33 which overlie and electrically contact the p-type elements 28. The other terminal 32 has similar contact fingers 34 which overlie and electrically contact the n-type elements 29. Of course, the contact fingers 33 and 34 can underlie the corresponding photoconductor elements if desired.

The electrical equivalent of the arrangement shown in FIGS. 5 and 6 is depicted in the circuit diagram shown in FIG. 7. There the p- and n-elements function as diodes arranged in parallel with respect to output lines across which the load resistance $R_L$ is arranged.

The ohmic terminals, either those shown at 21 and 22 in FIG. 2 or those shown at 31–34 in FIG. 5, may be applied by evaporation through a mask (not shown). After the semiconductor material has been deposited on the substrate surface and the ohmic terminals applied, the assembly can then be heated in a vacuum chamber, the temperature of which depends upon the semiconductor material employed to render the total exposed semiconductor area either p-type or n-type by introducing controlled amounts of impurities in the form of vapors or gases. For example, let it be assumed that the exposed area has been rendered n-type. After doping the heated surface of the exposed semiconductor areas, the vacuum chamber is purged of the donor gases or vapors and a pattern of $SiO_2$ may be evaporated through a mask to areas which are to remain n-type only. The substrate is once again heated to the proper temperature while maintaining a vacuum over the coated surface. At this stage acceptor gases or vapors are introduced into the vacuum chamber in controlled amounts, and are deposited into the exposed semiconductor areas which are not produced by the glassy resist, thus rendering these areas p-type.

If desired, the large area, thin-film photovoltaic generator or solar cell can be further protected by evaporating a coating of SiO (not shown) over the entire surface except the end terminations which are to be left exposed for electrical connections.

From the foregoing, it will be seen that the two embodiments of the present invention illustrated and described achieve the objects stated. The scope of the invention is to be measured by the appended claims and not to be restricted by the embodiments given.

What is claimed is:

1. A flexible sheet thin-film photovoltaic generator, comprising a substrate about one-half mil thick having an insulative surface, a plurality of p-type and n-type semiconductive elements alternately arranged on said surface in abutting relation to provide p-n junctions separated by only one of such elements, the thickness of said elements falling in the range from about one to five microns, a first electrode terminal including a plurality of conductive strips electrically connecting and overlying said p-type elements, and a second electrode terminal including a plurality of conductive strips electrically connecting and overlying said n-type elements, whereby said p-n junctions are connected in parallel.

2. A flexible sheet thin-film photovoltaic generator, comprising a substrate about one-half mil thick having an insulative surface, a plurality of pairs of abutting p-type and n-type semiconductor elements on said surface to provide a corresponding number of p-n junctions, the thickness of said elements falling in the range from about one to five microns, and means electrically connecting said pairs in series and comprising ohmic terminations including a plurality of conductive strips interposed between and directly contacting the p-type and n-type elements of adjacent pairs.

3. A flexible sheet thin-film photovoltaic generator, comprising a substrate about one-half mil thick having an insulative surface, a plurality of pairs of abutting p-type and n-type semiconductor elements on said surface to provide a corresponding number of p-n junctions, the thickness of said elements falling in the range from about one to five microns, and means electrically connecting said pairs in series and comprising ohmic terminations including a plurality of conductive strips interposed between and directly contacting the p-type and n-type elements of adjacent pairs and ohmic terminals at opposite ends of the endmost of said pairs and each contacting the corresponding endmost element.

References Cited

UNITED STATES PATENTS

| | | | |
|---|---|---|---|
| 2,381,819 | 8/1945 | Graves et al. | 136—225 |
| 2,402,662 | 6/1946 | Ohl | 136—89 |
| 2,407,678 | 9/1946 | Ohl | 136—206 X |
| 2,904,613 | 9/1959 | Paradise | 136—89 |
| 2,949,498 | 8/1960 | Jackson | 136—89 |
| 3,005,862 | 10/1961 | Escoffery | 136—89 |
| 3,069,603 | 12/1962 | Hunter | 317—234 |
| 3,186,873 | 6/1965 | Dunlap | 136—89 |
| 2,588,254 | 3/1952 | Lark-Horovitz et al. | 136—89 |
| 2,820,841 | 1/1958 | Carlson et al. | 136—89 |
| 2,915,578 | 12/1959 | Pensak | 136—89 |
| 2,919,299 | 12/1959 | Paradise | 136—89 |
| 2,999,240 | 9/1961 | Nicoll | 136—89 |

OTHER REFERENCES

Waltz, M. C.: Bell Labs. Record, July 1955, pages 260–62.

ALLEN B. CURTIS, *Primary Examiner.*

U.S. Cl. X.R.

250—211; 317—234